United States Patent
Petroz

(10) Patent No.: US 7,034,311 B2
(45) Date of Patent: Apr. 25, 2006

(54) DEVICE FOR PHOTOELECTRIC DETECTION AND IN PARTICULAR OF X OR Y RADIATION

(75) Inventor: Gérard Petroz, Montbonnot (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 11/131,007

(22) Filed: May 17, 2005

(65) Prior Publication Data
US 2005/0236575 A1 Oct. 27, 2005

Related U.S. Application Data

(63) Continuation of application No. PCT/FR03/03550, filed on Dec. 2, 2003.

(30) Foreign Application Priority Data
Dec. 19, 2002 (FR) .................................. 02 16149

(51) Int. Cl.
*H01J 27/00* (2006.01)
(52) U.S. Cl. ................................. 250/370.09
(58) Field of Classification Search ............ 250/370.09
See application file for complete search history.

(56) References Cited

U.S. PATENT DOCUMENTS 6,034,725 A * 3/2000 Franklin et al. ............ 348/310
6,175,120 B1 1/2001 McGregor et al.
6,340,812 B1 1/2002 Izumi et al.
6,847,039 B1 * 1/2005 Mochizuki ............. 250/370.09

FOREIGN PATENT DOCUMENTS

FR 2 793 954 11/2000
JP 57162372 10/1982
JP 11087683 3/1999

OTHER PUBLICATIONS

J. P. Ponpon, "A Review of OHMIC and Rectifying Contacts on Cadmium Telluride", *Solid-State Electronics*, vol. 28, No. 7, pp. 689-706, 1985.
E. Janik and R. Triboulet, "Ohmic contacts to p-type cadmium telluride and cadmium mercury telluride", *J. Phys. D: Appl. Phys.*, 16 (1983) pp. 2333-2340.

* cited by examiner

*Primary Examiner*—Otilia Gabor
(74) *Attorney, Agent, or Firm*—Burr & Brown

(57) ABSTRACT

A photoelectric detection device detecting X or gamma radiation having a monolithic matrix detector made of a semiconductor material. One side of the detector includes a plurality of detecting electrodes, each electrode corresponding to one pixel. Each electrode is electrically connected to a reading circuit, and is separated from the adjacent electrodes by an insulating interpixel region. The detecting electrodes and the interpixel region are located at two different levels of the detector face. The detecting electrodes are positioned within deeply etched regions in the surface of the semiconductor material, which are surrounded by the interpixel regions.

14 Claims, 2 Drawing Sheets

DEVICE FOR PHOTOELECTRIC DETECTION AND IN PARTICULAR OF X OR Y RADIATION

CROSS REFERENCE TO RELATED APPLICATIONS

This application is a continuation of International Application No. PCT/FR2003/003550 having an international filing date of Dec. 2, 2003, which designated the United States, the entirety of which is incorporated herein by reference.

This application also claims the benefit of French Application 02.16149, filed Dec. 19, 2002, the entirety of which is incorporated herein by reference.

FIELD OF THE INVENTION

The invention relates to a photoelectric detection device, more particularly to one dedicated to detecting X-rays and γ-rays, and employing semiconductor detectors, more specifically monolithic matrix detectors.

BACKGROUND OF THE INVENTION

More precisely, the aim of the invention is to provide a particular embodiment of the detection electrodes for such matrix detectors.

There are various types of radiation detectors, including, conventionally, gas detectors, scintillator detectors and semiconductor detectors. The latter detectors have the advantage of possessing a high atomic number, allowing a maximum number of incident photons to be absorbed for a minimum material thickness.

Furthermore, they also have the dual advantage of converting the photon signal directly into an electrical signal, without prior conversion into a light signal, and of having a relatively wide bandgap. In other words, semiconductor detectors therefore allow effective conversion of radiation into electrical signals with a small material thickness (a few millimeters).

The semiconductors more particularly chosen are of the II-VI type, such as for example CdZnTe, CdTe, Cl:CdTe, Cl:CdTeSe, Cl:CdZnTe, In:CdTd and In:CdZnTe.

These cadmium/tellurium-based semiconductors may especially be obtained, for example, by a Bridgman or THM growth method and they have, as major characteristics, a very high electrical resistivity ($10^8$–$10^{11}$ Ω·cm) essential for producing an X-ray or γ-ray spectrometer dedicated more particularly to medical, industrial or scientific imaging.

The actual detector therefore comprises a photosensitive material, consisting of a parallelepiped made of a semiconductor material, conventionally cut out from an ingot slice, resulting from the production of said semiconductor, and it has at least two parallel faces on which the electrical contacts, for biasing and for receiving the electrical signals generated by the incident radiation, are produced.

For example, one of the faces receives a full-face bias electrode, and the opposite face is intended to receive a plurality of what are called detection electrodes, these being distributed in a matrix form and defining the pixels for the location of the point of impact of the incident radiation on the detector.

Other architectures may be envisioned; in particular, the face receiving the radiation is not necessarily coated with an electrode.

To be able to have the most effective detector possible, the electrical contacts produced on the electrodes, especially the detection electrodes, must not modify the behavior of the device and must consequently have a negligible resistance to the current flow, in comparison to that of the material. These contacts must be of the ohmic type, that is to say they must have an almost linear current-voltage characteristic, advantageously use judicious band bending at the metal/semiconductor contact, exhibit a tunnel effect at this point, and undergo recombination in the space charge region.

The major difficulty therefore lies in how to produce these ohmic contacts on semiconductor materials, especially of the II-VI type, as, apart from the appropriate electrical behavior that it is necessary to obtain, the electrodes must then be connected, for example, to a read circuit.

These difficulties are therefore based on various problems involving the materials employed, apart from the increasingly reduced size of the detection electrodes.

Firstly as regards the electrodes, it is difficult to produce an ohmic contact with a high-resistivity material, of the CdTe type (and its compounds), owing to the high work function (5.02 eV) of CdTe. In fact, only platinum and gold can be employed. Such contacts are produced by evaporation or sputtering, and are neither ohmic nor blocking, but lie between the two.

At the same time, other physico-chemical phenomena, such as the surface states before deposition of the metal or oxidation of the surface, fix the height of the potential barrier independently of the work function of the metal.

As a result, it is therefore possible to obtain an ohmic contact if the carriers can flow freely by a tunnel effect.

This mode of transport is favored by electrochemical deposition of metal from gold chloride ($AuCl_3$) or platinum chloride ($PtCl_4$) solutions on a surface that has been chemically etched beforehand.

The metal is chemically reduced by tellurium and acts as a strong accepter dopant on the surface of the detector (see the 1985 publication by J. P. Ponpon, Solid State Electronics, Vol. 28, No. 7, 689, (1985); and J. Phys., Applied Physics 16(83), 2333–2340 by Janick and Triboulet—CNRS).

This metal deposited by electrochemical deposition (also called electroless plating), from gold or platinum chloride, takes the place of cadmium on the surface of the detector, said cadmium enriching the electrochemical solution.

The maximum thickness deposited owing to the polarization effect and to the intrinsic strains in the layer is in general less than 500 Å. Furthermore, the adhesion of the contact depends on the preparation of the surface, on the chemistry of the metal/semiconductor interface, on the thickness of the deposit, but also on its area.

Now, the tendency in for example the field of nuclear detection is to go toward producing pixelated monolithic detectors in which the area of each individual electrode will tend, long term, toward 50 μm², whereas at the present time it is a few square millimeters. Adhesion therefore constitutes a critical parameter, in particular during the assembly operations.

This adhesion is therefore of paramount importance, the more so as the materials present do not have the same expansion coefficients. Temperature variations consequently induce strains.

Furthermore, the ohmic contact generally produced on these materials has the drawback inherent in the small thickness of the electrode which, as already mentioned, is typically less than 500 Å.

Consequently, the connection to a read circuit proves to be difficult and generally requires the metal deposit constituting the electrode to be thickened, so as to reach a few thousand ångströms at said electrode, especially in order to guarantee a quality connection.

Now, the deposition of such a thickening layer, by vacuum deposition or by the addition of microdrops of conductive adhesive, also poses a problem since it is not uncommon for such a layer to overhang beyond the actual electrode, capable of impairing the precision of the final detection obtained.

Another difficulty lies in the regions separating each of the detection electrodes, called hereafter interpixel regions.

Specifically, to end up with correct operation of the detector, especially in terms of precision, the electrical resistance between each pixel, that is to say between each detection electrode, must be a maximum and typically similar to the intrinsic resistance of the detector material, and typically a few gigaohms, so as to avoid interactions between pixels.

It is possible to maintain such a high resistance only by avoiding any contamination between the pixels, this being conventionally achieved by protecting the corresponding surface of the detector, either by passivation or by encapsulation of an inert and perfectly impermeable material.

However, the deposition of such layers, particularly encapsulation layers, is tricky, especially for such small dimensions, since these layers generally are of an organic nature, and not etchable.

SUMMARY OF THE INVENTION

The object of the present invention is to propose a photoelectric detector that overcomes these various drawbacks.

The invention therefore relates to a photoelectric detection device, more particularly intended for detecting X-rays or γ-rays, which comprises a monolithic matrix detector made of a semiconductor material, one face of which includes a plurality of detection electrodes, according to a pixelization principle, each electrode corresponding to a pixel, being intended to be electrically connected, especially to a read circuit, and being separated from the adjacent electrodes by an insulating intermediate region, called an interpixel region, the detection electrodes and the interpixel regions being located at two different levels within the detector.

It is characterized in that the detection electrodes are positioned on the surface of the semiconductor material after a deeply etched region, provided in the regions for implanting said electrodes, has been produced.

In other words, the invention consists in providing the detection face of the detector in such a way that the detection electrodes and the interpixel regions do not lie in one and the same level, that is to say they do not lie in the same plane, and especially that the detection electrodes lie at a level below that of the interpixel regions. Various advantages obtained by this particular configuration will be demonstrated later in the description.

Advantageously, the semiconductor material is of the II-VI type.

Furthermore, according to one particular embodiment of the invention, the matrix detector has a face oriented toward the incident beam of radiation to be detected, and coated with a bias electrode, and the opposite face of which includes a plurality of detection electrodes of the type of those described above.

BRIEF DESCRIPTION OF THE DRAWINGS

The way in which the invention can be realized and the advantages that stem therefrom will become more clearly apparent from the following illustrative examples, given by way of indication but implying no limitation, supported by the appended figures.

DETAILED DESCRIPTION OF THE INVENTION

The description that follows is aimed more particularly at the actual radiation detector (1).

Figure 1:
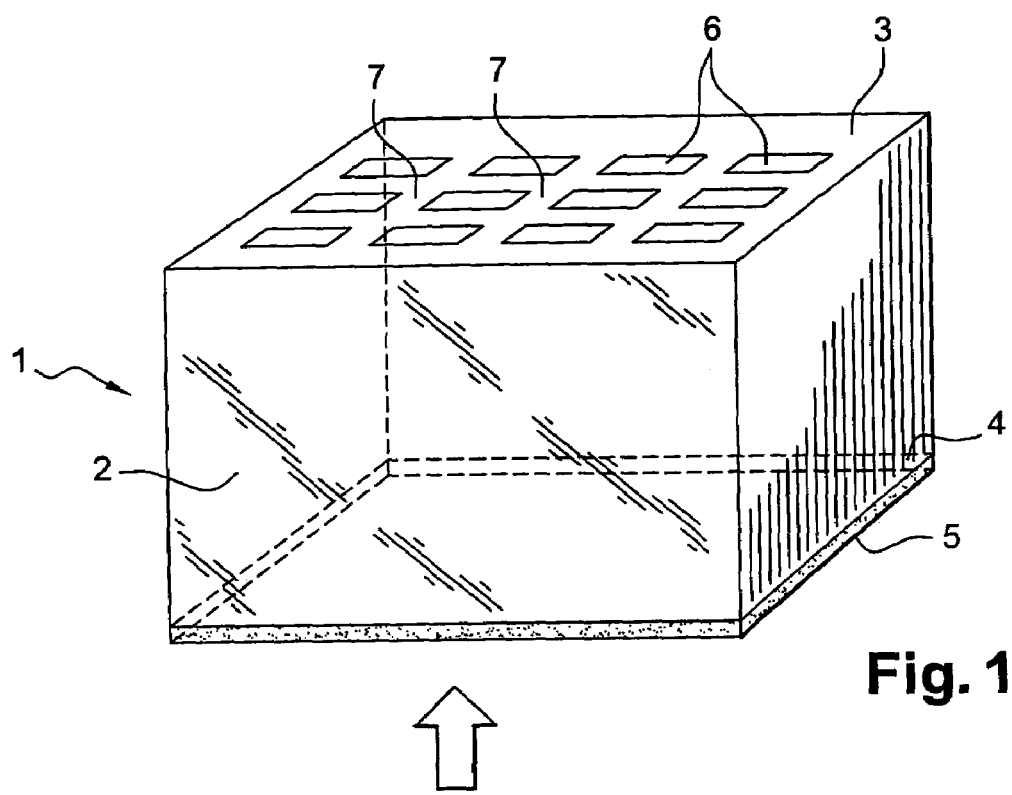
FIG. 1 is a schematic perspective representation of the detector according to the invention.

This detector is shown schematically in FIG. 1. It is basically made of an active material (2), consisting of a semiconductor, for example of the II-VI type, of the CdTe family.

It has two parallel faces, a detection face (3) and a lower face (4) respectively, the latter being turned toward the incident radiation, shown schematically by the arrow at the bottom of FIG. 1.

The lower face (4) is coated with a common bias electrode (5) deposited conventionally, for example by full-face gold plating using the electroless technique.

The detection face (3) itself receives a plurality of detection electrodes (6) that are distributed in a matrix form and separated from one another by nonconducting interpixel regions (7).

Figure 2:
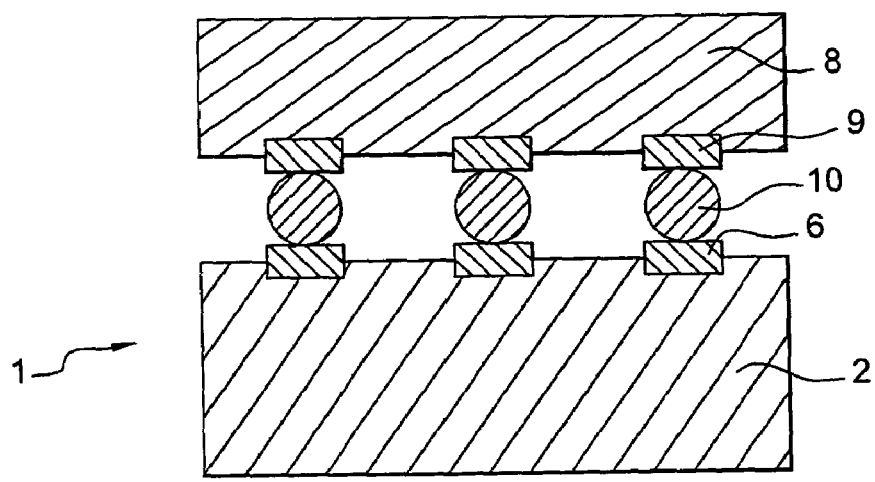
FIG. 2 is a schematic sectional representation of the principle of how the detector is assembled with a read circuit.

This detection face (3), and more particularly the detection electrodes (6) that it incorporates, are intended to be connected, as already mentioned, to an operating circuit, especially a read circuit, for example using the flip-chip bonding technique, that is to say using indium microballs (10), as shown in FIG. 2.

These indium microballs connect the electrodes to the electrodes (9) of the read circuit (8). This technology is well known to those skilled in the art, so that it is unnecessary to describe it here in detail.

Figure 3:
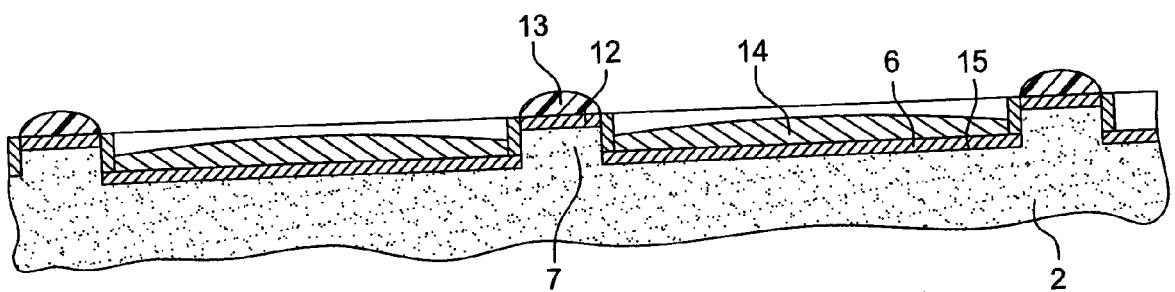
FIG. 3 is a schematic sectional representation illustrating the production of the detection face of the detector according to the invention.

According to the invention, as shown in FIG. 3, the upper face (3) of the active material (2) undergoes deep etching (15) at the subsequent position of the detection electrodes (6). The etching profile obtained depends on the technique used (wet etching or dry etching), but also on the conditions used (etch speed concentration, stirring).

The surface finish obtained from such etching is more disturbed than that from light etching, on account of the precipitates arising from defects in the material, giving rise to additional points of attachment to the deposited electrode, and thus increases its adhesion to said active material (2).

The detection electrodes (6), typically made of gold or platinum, are then deposited, by conventional techniques already mentioned, especially by electroless plating using gold chloride or platinum chloride solutions, the interpixel regions being for example protected by a photoresist.

Advantageously, these electrodes receive an additional, thickening layer called an overlay (14), based for example on silver or gold, and limited strictly to the electrode. This overlay (14) promotes the mechanical strength of the subsequent electrical connection, in particular by being anchored onto the sidewalls of the deeply etched region.

As a corollary, the interpixel regions also receive a passivation layer (12), for example made of an oxide, obtained by local chemical reaction of the surface with an oxidizing agent. Furthermore, this passivation layer is optionally supplemented with an encapsulation layer (13), for example made of an acrylic resin deposited manually.

As may be clearly seen in FIG. 3, the overlay (14) deposited on the detection electrode (6) is both sufficient but nevertheless such that, in this configuration, the detection electrode lies at a level below the interpixel regions (7).

This technical solution makes it possible firstly to achieve better physical limitation of the overlay (14) in the etched volume.

Moreover, this configuration makes it possible to substantially improve the adhesion of the final electrode, depending on the edge etching profile, favorable to mechanical tear strength, especially for electrodes of small dimensions, typically less than 100 μm, which constitute one of the objectives sought in this technical field.

Typically, the differences in level, irrespective of the embodiments obtained, between the detection electrodes (6) and the interpixel regions (7) may be from a few microns to several tens of microns.

This difference in level makes it possible, as already mentioned, to eliminate the risks of reciprocal contamination, and therefore to reduce the risks of optical intermodulation, and hence promotes the quality of the detection.

One embodiment that can be envisioned for producing the particular configuration of detectors as shown in FIG. 3 will be described below.

After conditioning the active material (a semiconductor), and after cutting and polishing to the desired dimensions, the material is firstly chemically etched in a known manner, especially on its upper face intended to form the detection face (3). Next, the bias electrode is deposited, which is protected with a resist or a wax.

A passivation step is then carried out on the detection face, followed by conventional photolithography. Next, the electrode implantation regions undergo deep chemical etching, for example using Br/methanol, the interpixel region being protected by passivation and the photolithography resist.

The electrodes are then deposited electrolessly, followed by the deposition of the electrode thickening material, that is to say the overlay (14) over the entire surface.

Next, a lift-off step is carried out, that is to say the resist protecting the interpixel regions (7) is dissolved in a solvent, which removes the thickening material deposited on top.

Finally, the material protecting the nonpixelized face is dissolved off and then the interpixel regions are encapsulated by the deposition or rolling-on of an encapsulant.

Lastly, the detector obtained is optionally heated in an oven.

All the benefits of the detector according to the invention are readily appreciated.

Firstly, better confinement both of the insulating materials and the conductors is achieved, while limiting the risks of optical intermodulation, and hence improving the precision of the detector.

The deposition techniques employed are simple and well controlled.

Finally, the techniques and the materials employed allow the mechanical strength of the detection electrodes on the material to be substantially improved, making the resulting final assembly reliable.

The invention claimed is:

1. A photoelectric detection device, for detecting X-rays or γ-rays, comprising:
   a monolithic matrix detector made of a semiconductor material; and
   a plurality of detection electrodes located on one face of the detector, each electrode corresponding to a pixel, being electrically connected, to a read circuit, and being separated from adjacent electrodes by an insulating an interpixel region,
   wherein the detection electrodes and the interpixel regions are located at two different levels within the detector, and the detection electrodes are positioned within deeply etched regions in the surface of the semiconductor material which are surrounded by the interpixel regions.

2. The photoelectric detection device as claimed in claim 1, characterized in that the detection electrodes are located at a level below that of the interpixel regions.

3. The photoelectric detection device as claimed in claim 1, characterized in that the semiconductor material is of the II-VI type.

4. The photoelectric detection device as claimed in claim 1, characterized in that the detection electrodes are coated with a thickening layer, which is also conducting.

5. The photoelectric detection device as claimed in claim 1, characterized in that the interpixel regions undergo a passivation treatment.

6. The photoelectric detection device as claimed in claim 1, characterized in that the interpixel regions receive an encapsulation layer.

7. The photoelectric detection device as claimed in claim 1, characterized in that the interpixel regions (undergo a passivation treatment and then receive an encapsulation layer.

8. A photoelectric detection device, more particularly for detecting X-rays or γ-rays, comprising:

a monolithic matrix detector made of a semiconductor material;

a bias electrode coated on a face of the detector oriented toward the incident beam of the radiation to be detected; and a plurality of detection electrodes located on an opposite face of the detector, each electrode corresponding to a pixel, being electrically connected to a read circuit, and being separated from the adjacent electrodes by an insulating interpixel region, wherein the detection electrodes Sand the interpixel regions are located at two different levels within the detector, characterized in that and the detection electrodes are positioned within deeply etched regions in the surface of the semiconductor material which are surrounded by the interpixel regions.

9. The photoelectric detection device as claimed in claim 8, characterized in that the detection electrodes are located at a level below that of the interpixel regions.

10. The photoelectric detection device as claimed in claim 8, characterized in that the semiconductor material is of the II-VI type.

11. The photoelectric detection device as claimed in claim 8, characterized in that the detection electrodes are coated with a thickening layer, which is also conducting.

12. The photoelectric detection device as claimed in claim 8, characterized in that the interpixel regions undergo a passivation treatment.

13. The photoelectric detection device as claimed in claim 8, characterized in that the interpixel regions receive an encapsulation layer.

14. The photoelectric detection device as claimed in claim 8, characterized in that the interpixel regions undergo a passivation treatment and then receive an encapsulation layer.

* * * * *